(12) United States Patent
Fan et al.

(10) Patent No.: US 11,011,417 B2
(45) Date of Patent: May 18, 2021

(54) METHOD AND STRUCTURE OF METAL CUT

(71) Applicant: International Business Machines Corporation, Armonk, NY (US)

(72) Inventors: Su Chen Fan, Cohoes, NY (US); Ruilong Xie, Niskayuna, NY (US); Andrew Greene, Slingerlands, NY (US); Veeraraghavan S. Basker, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/428,008

(22) Filed: May 31, 2019

(65) Prior Publication Data

US 2020/0381296 A1 Dec. 3, 2020

(51) Int. Cl.
*H01L 21/768* (2006.01)
*H01L 23/522* (2006.01)
*H01L 23/528* (2006.01)
*H01L 21/02* (2006.01)

(52) U.S. Cl.
CPC .... *H01L 21/76831* (2013.01); *H01L 21/0217* (2013.01); *H01L 21/02178* (2013.01); *H01L 21/02186* (2013.01); *H01L 21/02192* (2013.01); *H01L 21/76804* (2013.01); *H01L 21/76877* (2013.01); *H01L 23/5226* (2013.01); *H01L 23/5283* (2013.01); *H01L 2221/1063* (2013.01)

(58) Field of Classification Search
CPC ............... H01L 21/31; H01L 21/31051; H01L 21/31053; H01L 21/32; H01L 21/76224; H01L 21/76229; H01L 21/76802
See application file for complete search history.

(56) References Cited

U.S. PATENT DOCUMENTS

| | | | |
|---|---|---|---|
| 9,490,129 B2 | 11/2016 | Hu et al. | |
| 9,524,974 B1 | 12/2016 | Kanezaki et al. | |
| 9,735,029 B1 | 8/2017 | Chu et al. | |
| 9,793,164 B2 | 10/2017 | Machkaoutsan et al. | |
| 9,818,747 B2 | 11/2017 | Smayling | |
| 9,977,854 B2 | 5/2018 | Rowhani et al. | |
| 10,685,874 B1* | 6/2020 | Xie | H01L 21/32133 |
| 2014/0264894 A1 | 9/2014 | Tien et al. | |
| 2015/0325482 A1 | 11/2015 | Hu et al. | |
| 2016/0056104 A1 | 2/2016 | Bouche et al. | |
| 2016/0190132 A1 | 6/2016 | Smayling | |
| 2017/0140986 A1 | 5/2017 | Machkaoutsan et al. | |

(Continued)

*Primary Examiner* — Jae Lee

(74) *Attorney, Agent, or Firm* — Douglas Pearson; Ryan, Mason & Lewis, LLP

(57) ABSTRACT

A method includes applying a first dielectric material onto a semiconductor substrate to form a first dielectric layer on the semiconductor substrate, creating a plurality of openings in the dielectric layer, depositing a sacrificial material within the openings of the dielectric layer, removing the sacrificial material from at least a first segment of a first trench of the openings, depositing a second dielectric fill material into the first segment of the first trench opening where the sacrificial material was removed, removing the sacrificial material from at least some of the remaining openings and depositing a metallic material within the first trench opening to define at least first and second lines in the first trench and form a metallic interconnect structure.

19 Claims, 9 Drawing Sheets

(56) References Cited

U.S. PATENT DOCUMENTS

2018/0018419 A1    1/2018   Rowhani et al.
2018/0019161 A1    1/2018   Chang et al.
2018/0269306 A1    9/2018   Bao et al.

* cited by examiner

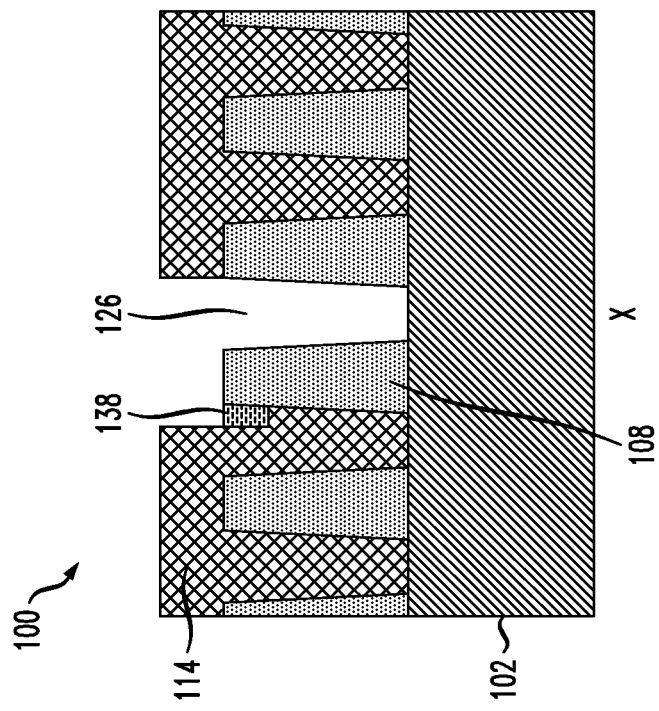
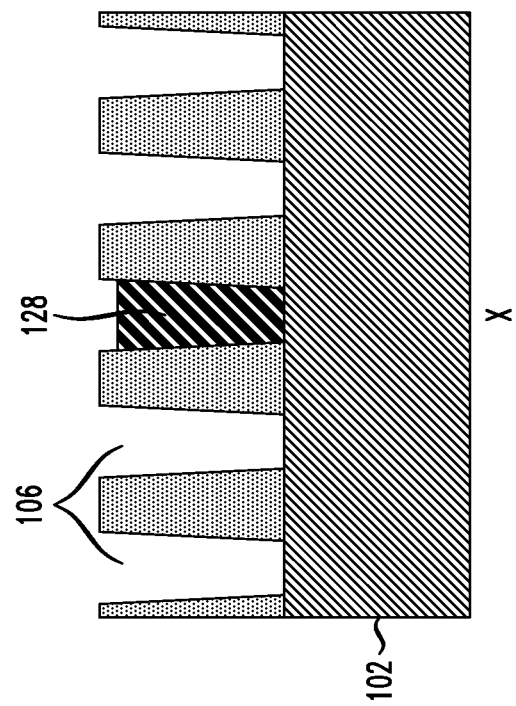

METHOD AND STRUCTURE OF METAL CUT

BACKGROUND

The present disclosure relates to semiconductor fabrication techniques and, in particular, relates to a back-end-of-line (BEOL) methodology and structure to create self-aligned metal cuts before metal fill.

A semiconductor integrated circuit chip is typically fabricated with a BEOL interconnect structure, which comprises multiple levels of metal lines and inter-level metal vias, to connect various integrated circuit components and devices that are fabricated as part of a front-end-of-line (FEOL)/middle-of-line (MOL) layer(s) of the semiconductor integrated circuit chip. Metal gaps are formed in some of the metal lines to avoid "shorts" in the circuit components. However, the gaps must be properly aligned and of appropriate size to maintain a well-defined "tip-to-tip spacing," between the ends of the metal lines otherwise significant degradation in yield, performance, and reliability may be observed.

SUMMARY

Embodiments of the present application provide techniques for self-alignment of metal cuts in a semiconductor component. In illustrative embodiments, the metal interconnect structure has pairs a lines with a relatively small metal tip-to-tip spacing. In one illustrative embodiment, a method comprises applying a first dielectric material onto a semiconductor substrate to form a first dielectric layer on the semiconductor substrate, creating a plurality of trench openings in the dielectric layer, depositing a sacrificial material within the trench openings of the dielectric layer, removing the sacrificial material from at least a first segment of a first trench opening of the trench openings, depositing a second dielectric material into the first segment of the first trench opening where the sacrificial material was removed, removing the sacrificial material from at least some of the remaining trench openings and depositing a metallic material within the first trench opening to define at least first and second lines in the first trench opening and form a metallic interconnect structure.

In another illustrative embodiment, a method is disclosed. The method comprises applying a first dielectric material onto a semiconductor substrate to form a first dielectric layer on the semiconductor substrate, creating a plurality of trench openings in the dielectric layer, depositing a sacrificial material within the trench openings of the dielectric layer, removing the sacrificial material from at least a first segment of a first trench opening of the trench openings to form a recess therein, depositing a liner material into a gap formed between the sacrificial material and one trench wall in the event that the recess at least partially extends to a second trench opening adjacent the first trench opening and depositing a metallic material within the trenches to form a metallic interconnect structure.

In another illustrative embodiment, a semiconductor device comprises a semiconductor substrate defining a vertical z-axis, a dielectric layer comprising a first dielectric material disposed on the semiconductor substrate, a plurality of trench openings formed in the first dielectric layer, a metallic material disposed in the trench openings to create a metal interconnect comprising a plurality of lines and at least one line having a first end and a second end, each of the first and second ends of the at least one line defining a positive tapered angle relative to the z-axis.

BRIEF DESCRIPTION OF THE DRAWINGS

FIGS. 1-20 schematically illustrate methods for fabricating metallic interconnect structures for semiconductor components according to one or more illustrative embodiments.

FIG. 1 is a schematic cross-sectional view of a semiconductor structure at an intermediate stage of fabrication including a semiconductor substrate and a first dielectric layer formed on the semiconductor substrate according to one or more illustrative embodiments.

FIG. 2 is a top schematic plan view illustrating the trench openings formed within the first dielectric layer according to one or more illustrative embodiments.

FIG. 3 is a cross-sectional view of the semiconductor structure along the x-axis of FIG. 2, illustrating the trench openings within the first dielectric layer according to one or more illustrative embodiments.

FIG. 4 is a cross-sectional view of the semiconductor structure along the y-axis of FIG. 2, illustrating the trench openings within the first dielectric layer according to one or more illustrative embodiments.

FIG. 5 is a top schematic plan view illustrating a pattern for depositing a first dielectric fill within select trench openings formed in the dielectric layer of the semiconductor structure according to one or more illustrative embodiments.

FIG. 6 is a cross-sectional view of the semiconductor structure along the x-axis of FIG. 5, illustrating the sacrificial material deposited on the dielectric layer, the hardmask and the photoresist layer deposited on the semiconductor substrate according to one or more illustrative embodiments.

FIG. 7 is a cross-sectional view of the semiconductor structure along the y-axis of FIG. 5, illustrating the sacrificial material deposited on the dielectric layer, the hardmask and the photoresist layer deposited on the semiconductor substrate according to one or more illustrative embodiments.

FIG. 8 is a cross-sectional view of the semiconductor structure along the x-axis, illustrating cavities formed in the sacrificial material according to one or more illustrative embodiments.

FIG. 9 is a cross-sectional view of the semiconductor structure along the y-axis, illustrating cavities formed in the sacrificial material according to one or more illustrative embodiments.

FIG. 10 is a cross-sectional view of the semiconductor structure along the x-axis, illustrating deposition of a dielectric till in the cavities within the sacrificial material according to one or more illustrative embodiments.

FIG. 11 is a cross-sectional view of the semiconductor structure along the y-axis, illustrating deposition of a dielectric fill in the cavities within the sacrificial material according to one or more illustrative embodiments.

FIG. 12 is a cross-sectional view of the semiconductor structure along the x-axis, illustrating removal of the sacrificial material from the semiconductor structure according to one or more illustrative embodiments.

FIG. 13 is a cross-sectional view of the semiconductor structure along the y-axis, illustrating removal of the sacrificial material from the semiconductor structure according to one or more illustrative embodiments.

FIG. 14 is a top schematic plan view illustrating deposition of metal within the trench openings of the dielectric layer to form the interconnect structure according to one or more illustrative embodiments.

FIG. 15 is a cross-sectional view of the semiconductor structure along the x-axis of FIG. 14, further illustrating the interconnect structure with the dielectric fill defining spacing within the metallic lines according to one or more illustrative embodiments.

FIG. 16 is a cross-sectional view of the semiconductor structure along the y-axis of FIG. 14, further illustrating the interconnect structure with the dielectric fill defining spacing within the metallic lines according to one or more illustrative embodiments.

FIG. 17 is a top schematic plan view illustrating a pattern for depositing a dielectric fill within select trench openings formed in the dielectric layer of the semiconductor structure where one opening of the pattern is misaligned relative to its respective trench according to one or more illustrative embodiments.

FIG. 18 is a cross-sectional view along the x-axis of the semiconductor structure of FIG. 17 illustrating the misaligned cavity formed in the sacrificial material according to one or more illustrative embodiments.

FIG. 19 is a cross-sectional view similar to the view of FIG. 18 illustrating deposition of a dielectric liner within a gap defined by the misaligned cavity to fill the gap according to one or more illustrative embodiments.

FIG. 20 is a cross-sectional view similar to the view of FIG. 19 illustrating deposition of a dielectric fill in the cavity and removal of the sacrificial material according to one or more illustrative embodiments.

DETAILED DESCRIPTION

Figure 1:
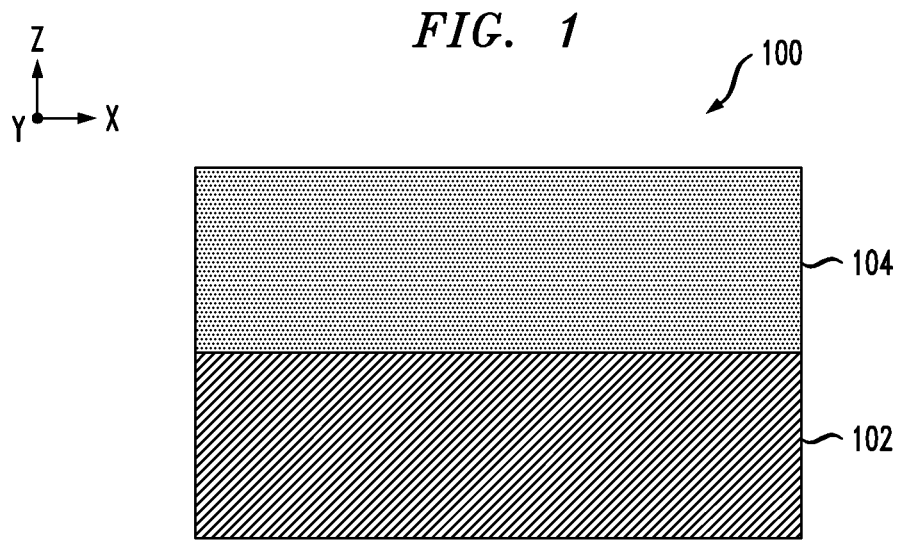

Embodiments will now be described in further detail with regard to semiconductor devices comprising metallic interconnect structures, as well as methods for fabricating metallic interconnect structures with a metal cut (for example, through an etching process) to form a gap in the line. It is known that the tip-to-tip spacing between lines has a high impact on the unit cell density of the semiconductor device. Reducing the tip-to-tip distance between lines will greatly increase the unit cell density which in turn will lead to a shrinkage in the device dimension. However, due to the line end shortening issue and the resolution limitation of photolithography, the currently available lithographic techniques can only achieve a tip-to-tip distance of not less than 100 nm. Illustrative embodiments address these concerns by providing a tip-to tip spacing between two lines ranging from about 5 nm to about 30 nm, and in some embodiments, less than 5 nm.

Illustrative embodiments also provide a method for correcting misaligned etched openings occurring as a result of photoresist or etching errors.

It is to be understood that the various layers, structures, and regions shown in the accompanying drawings are schematic illustrations that are not drawn to scale. In addition, for ease of explanation, one or more layers, structures, and regions of a type commonly used to form semiconductor devices or structures may not be explicitly shown in a given drawing. This does not imply that any layers, structures, and regions not explicitly shown are omitted from the actual semiconductor structures. Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the drawings to denote the same or similar features, elements, or structures, and thus, a detailed explanation of the same or similar features, elements, or structures will not be repeated for each of the drawings. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error is present, such as 1% or less than the stated amount. Further, the terms "vertical" or "vertical direction" or "vertical height" as used herein denote a Z-direction of the Cartesian coordinates shown in the drawings, and the terms "horizontal," or "horizontal direction," or "lateral direction" as used herein denote an X-direction and/or Y-direction of the Cartesian coordinates shown in the drawings.

Methods for fabricating metallic interconnect structures will now be discussed in further detail with reference to FIGS. 1 through 20, which schematically illustrate a semiconductor device or structure at various stages of fabrication. To begin, FIG. 1 is a schematic cross-sectional side view of a semiconductor structure 100 at an intermediate stage of fabrication comprising a semiconductor substrate 102 and an interlayer first dielectric layer 104 disposed on the semiconductor substrate 102. The semiconductor substrate 102 of FIG. 1 may include any layer or component (e.g., a semiconductor wafer) and at least one FEOL (front-end-of-line) layer incorporating the various semiconductor devices and components that are formed in or on the active surface of the wafer to provide integrated circuitry for a target application. In FIG. 1, the semiconductor wafer and the at least one FEOL layer are incorporated into the semiconductor substrate 102.

The semiconductor wafer may be a generic wafer layer, and may comprise one of different types of semiconductor substrate materials. For example, in one embodiment, the semiconductor wafer may include a bulk wafer that is formed of silicon (Si) or germanium (Ge), or other types of semiconductor wafer materials that are commonly used in bulk semiconductor fabrication processes such as a silicon-germanium alloy, compound semiconductor materials (e.g. III-V), etc. In another embodiment, the semiconductor substrate may be an active semiconductor layer of an SOI (silicon-on-insulator) material, GeOI (germanium-on-insulator) material, or other type of semiconductor-on-insulator substrate, which comprises an insulating layer (e.g., oxide layer) disposed between a base substrate layer (e.g., silicon substrate) and the active semiconductor layer (e.g., Si, Ge, etc.) in which active circuit components are formed as part of the FEOL.

As noted above, the FEOL component of the semiconductor substrate 102 may comprise various semiconductor devices and components. For example, the FEOL layer may comprise field-effect transistor (FET) devices (such as Fin-FET devices, vertical FET devices, planar FET devices, etc.), bipolar transistors, diodes, capacitors, inductors, resistors, isolation devices, etc., which are formed in or on the active surface of the semiconductor structure 100. In general, FEOL processes typically include preparing the wafer, forming isolation structures (e.g., shallow trench isolation), forming device wells, patterning gate structures, forming spacers, forming source/drain regions (e.g., via implantation), forming silicide contacts on the source/drain regions, forming stress liners, etc.

In the example process flow illustrated in FIG. 1, the first dielectric layer 104 is formed as part of an initial or later phase of a BEOL process module to form a metallization level of a BEOL interconnect structure. The first dielectric layer 104 comprises a first dielectric material including a layer of ultra "low k" insulating/dielectric material such as silicon oxide (e.g. $SiO_2$), silicon nitride (SiN), silanol (SiOH), hydrogenated silicon nitride (SiNH), silicon carbide (SiC), silicon carbon nitride (SiCN), hydrogenated silicon carbide (SiCH), fluorine-doped silicon oxide (SiOF), carbon doped oxide (CDO), SiOC films or SiOCH low-k films and other similar types of insulating/dielectric materials or porous dielectrics which are non-reactive with the metallic material that is used to form metallic interconnect structures in the BEOL. The first dielectric layer 104, in an embodiment designed to minimize capacitive coupling, has a dielectric constant of 3.0 or less. The height of the first dielectric layer 104 defines a vertical height (or thickness) of the metallization that is formed within the first dielectric layer 104, which will vary depending on the application. For example, in one embodiment, the first dielectric layer 104 is formed with a thickness in a range of about 20 nm to about 800 nm. The first dielectric layer 104 is formed using known deposition techniques, such as, for example, ALD (atomic layer deposition), CVD (chemical vapor deposition) PECVD (plasma-enhanced CVD), or PVD (physical vapor deposition), or spin-on deposition.

Figure 2:
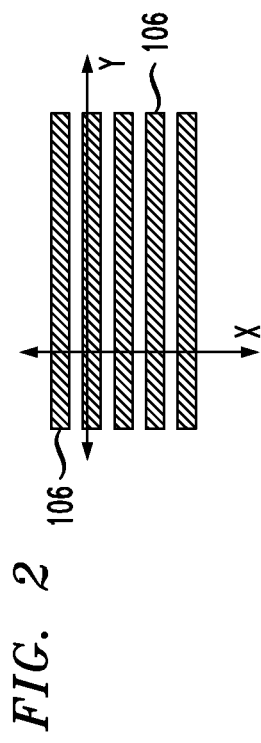
Figure 4:
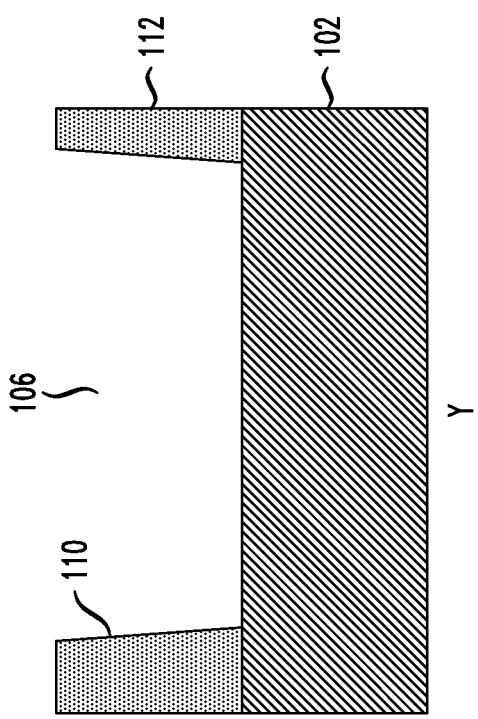
Figure 3:
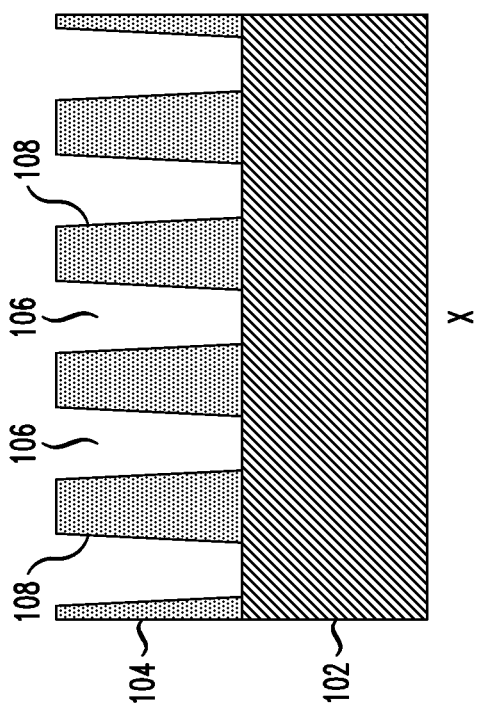

In FIGS. 2-4, the first dielectric layer is depicted subsequent to patterning of the first dielectric layer 104 such that a plurality of trench openings 106 in the first dielectric layer 104 are formed. Patterning of the first dielectric layer 104 can be implemented using any conventional photolithography and etching process, e.g., forming a photoresist mask on the upper surface of the dielectric layer 104, which comprises an image of the trench openings 106 to be etched into the dielectric layer 104, followed by etching the dielectric material of the first dielectric layer 104 using a dry etch process such as RIE (reactive ion etching). FIG. 3 is a cross-sectional view taken along the x-axis of FIG. 2 and depicts the trench openings 106 and the trench walls 108 which define the respective trench openings 106. FIG. 4 is a cross-sectional view taken along the y-axis of FIG. 2 through a trench opening 106. In FIG. 4, the trench end walls 110, 112 are depicted.

Figure 7:
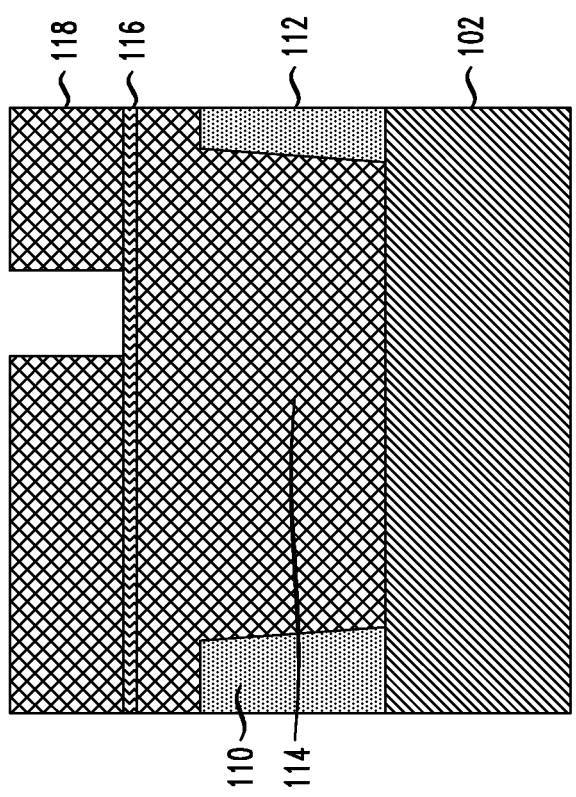
Figure 5:
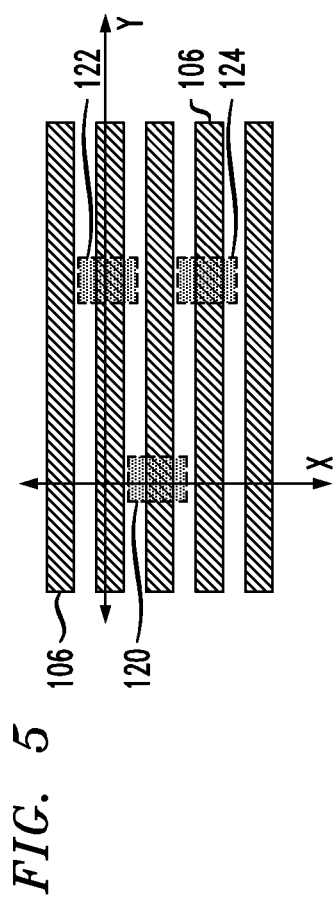
Figure 6:
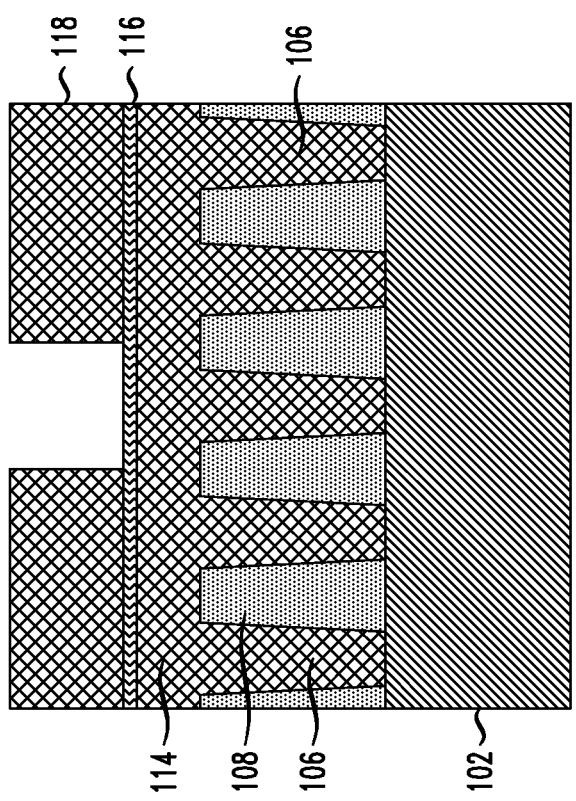

With reference to FIGS. 5-7, once the trench openings 106 are formed in the first dielectric layer 104, the process is continued by depositing a sacrificial material 114, e.g., an organic planarization layer (OPL), onto the semiconductor structure 100 and the dielectric layer 104 to fill the trench openings 106. The organic planarization layer (OPL) is deposited from solution, e.g., by any conventional deposition process, and is baked at high temperature. The organic planarization layer (OPL) 114 typically fills the trench openings 106, and can extend atop the upper surfaces of the first dielectric layer, as depicted in FIGS. 6 and 7. The OPL is self-leveling and achieves planarization over the surface topography without the use of etching, chemical mechanical polishing, or other conventional planarization techniques. The sacrificial material 114 in the form of the OPL can include an organic polymer made up of a light-sensitive material that, when exposed to electromagnetic (EM) radiation, is chemically altered and thus configured to be removed using a developing solvent. For example, the photo-sensitive organic polymer may be polyacrylate resin, epoxy resin, phenol resin, polyamide resin, polyimide resin, unsaturated polyester resin, polyphenylenether resin, polyphenylenesulfide resin, or benzocyclobutene (BCB). More generally, for example, the developable sacrificial material 114 may be made up of any organic polymer having a molecular structure that can attach to the dielectric layer. The OPL layer may have a thickness in ranging from about 50 nm to about 500 nm.

With continued reference to FIGS. 5-7, a hard mask film 116 is then deposited on the sacrificial material 114. The hard mask film 116 may include any suitable material, such as, for example, a metal oxide including titanium oxide (TiOx), SiARC, SiON, $SiO_2$ TiARC, etc. and can have a thickness of about 5 nm to about 50 nm. In some embodiments, the hardmask film 116 is a TiOx layer having a thickness of about 25 nm. The hardmask film 116 may be deposited on the sacrificial material 114 using any known techniques including, for example, by a plasma enhanced atomic layer deposition (PEALD) process, a plasma-enhanced chemical vapor deposition (PECVD) process or a physical vapor deposition (PVD) process, CVD, ALD, etc. The deposition process may be performed using a starting precursor having Ti, O, C and N in the deposition chamber. Additionally, parameters related to deposition may be altered in order to improve the wet etch rate of the resulting structure.

Thereafter, a layer of photoresist 118 is deposited over the hardmask film 116 (with an optional antireflective layer deposited between the hardmask and the photoresist), and the photoresist 118 is patterned as desired, for example, by exposing the photoresist layer to radiation (e.g., ultraviolet radiation, electron beam, x-ray, ion beams, etc.) through a lithographic photomask, and then applying an aqueous developer solution to the exposed photoresist layer to pattern the photoresist layer. In one illustrative embodiment, an ARC layer (not shown) may be utilized to reduce reflection of light from a layer to be etched during exposure of a photoresist layer formed over the ARC layer. The ARC layer may comprise an organic or inorganic anti-reflection coating. In one illustrative embodiment, the ARC layer comprises a silicon ARC (Si-ARC) layer. In an illustrative embodiment, the photoresist pattern 118 is formed by depositing (e.g., spin coating) a layer of photoresist material over the ARC layer, and then exposing and developing the layer of photoresist material to form the photoresist pattern 118. In some embodiments, the thickness of the photoresist layer is in a range of about 20 nm to about 800 nm, although lesser and greater thicknesses can also be employed. The photoresist layer can be a layer of a positive photoresist material that is sensitive to deep-ultraviolet (DUV) radiation, extreme ultraviolet (EUV), or mid-ultraviolet (MUV) radiation as known in the art, or the photoresist layer can be an e-beam resist material that is sensitive to radiation of energized electrons. Negative photoresist material is also contemplated.

FIG. 5 schematically illustrates one exemplative photoresist pattern including resist images 120, 122, 124. FIGS. 6 and 7 are cross-sectional views along the x and y axes. As indicated hereinabove, any conventional methodology for forming the photoresist pattern is envisioned. Lasers are typically used for alignment of the pattern with the underlying structures, and, hence, the hardmask film 116 should be substantially transparent at the wavelengths used for alignment. As best depicted in FIG. 5, the resist image 120 is within a first trench segment of a first trench opening 106 and the second resist image 122 is within a second trench segment of a second trench opening 106.

Figure 9:
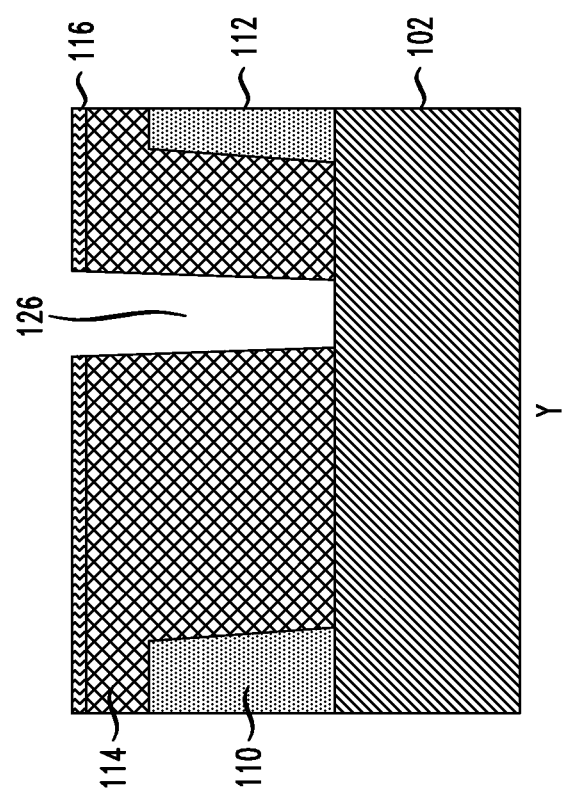
Figure 8:
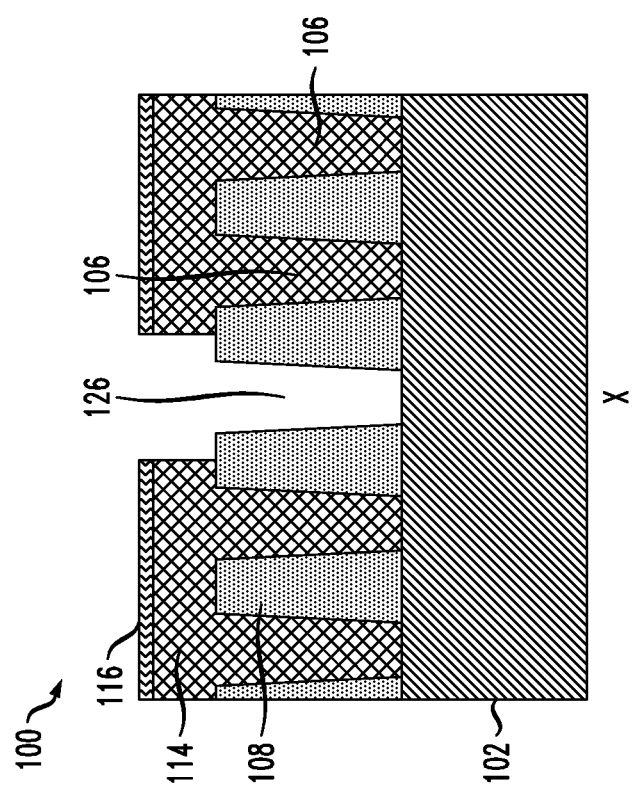
Figure 11:
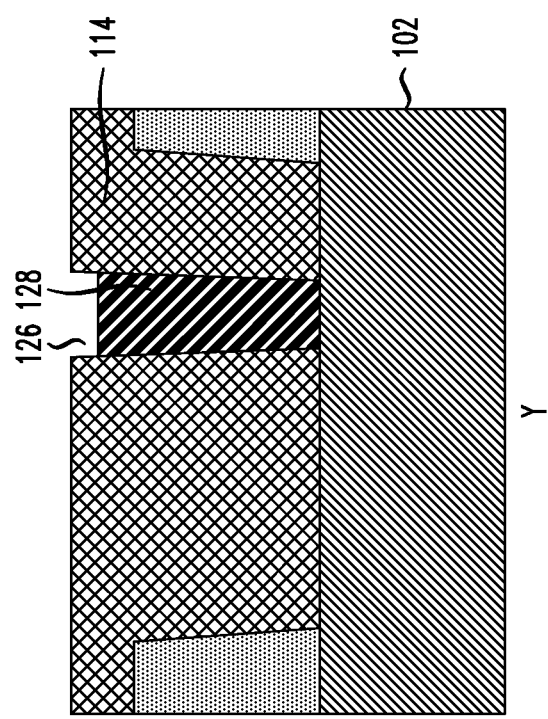
Figure 10:
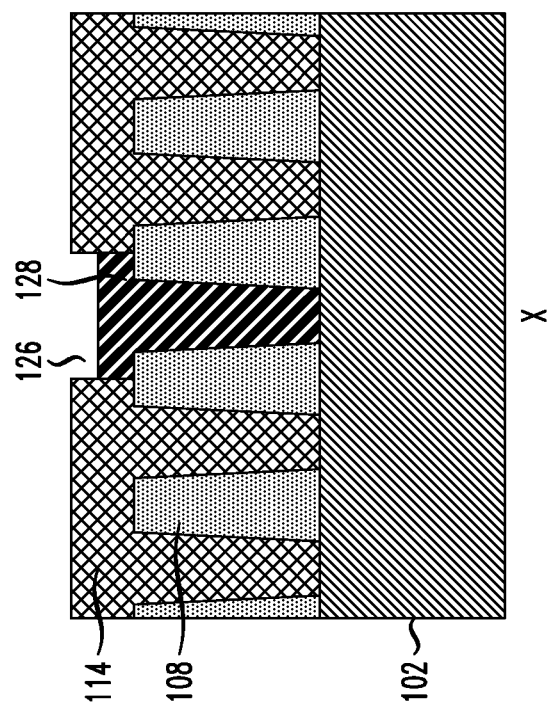

After the photoresist 118 is developed and patterned, the hardmask film 116 and the underlying segment of the sacrificial material (e.g., OPL) beneath the resist images 120, 122 of the photoresist 118 are removed such that recesses 126 within the first and second trench segments having features of required dimensions are formed into the hardmask 116 and the sacrificial material 114 as depicted in FIGS. 8-9. In one methodology, a conventional etching process, e.g., reactive ion etching (RIE) (with, e.g., a halogen-based plasma chemistry) is utilized to remove the hardmask 116 and the underlying sacrificial OPL material. The OPL etch process is selective to the material of the dielectric layer 104. For example, the trench opening 126 has a larger size than the trench size in the dielectric 104. The etch process self-aligns to the trench which removes the OPL inside the trench without damaging the dielectric 104. The remaining hardmask 116 serves to protect those portions of the dielectric layer that need to be preserved during the etching process. Referring now to FIGS. 10-11, the etched recesses 126 are then filled with a second dielectric material 128 different from the first material forming the first dielectric layer 104. The second dielectric material 128 will establish a metal cut region in the metal interconnect. The metal cut process mitigates the tight metal tip-to-tip requirement because this could achieve smaller tip-to-tip space compared to directly printing the two metal lines using lithography. The material 128 could be any suitable materials including a low temperature oxide, silicon nitride (SiN) deposited by CVD at low temperature LTO, an aluminum oxide ($Al_2O_3$) or SiCO, SiC, SiOCN, etc. The upper surface segment of the secondary dielectric fill is removed via an etching process or a chemical-mechanical polish (CMP) process to expose the underlying sacrificial OPL material 114. The remaining hard mask may also be removed via an etching process.

Figure 12:
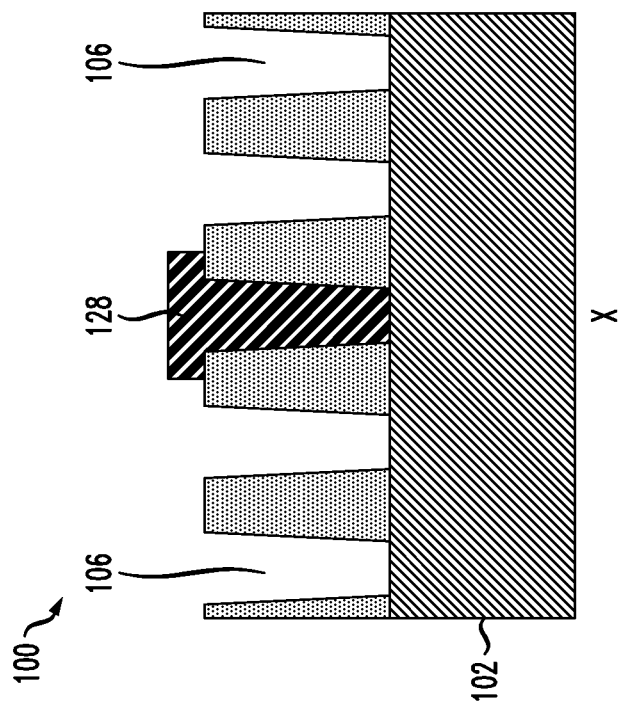
Figure 13:
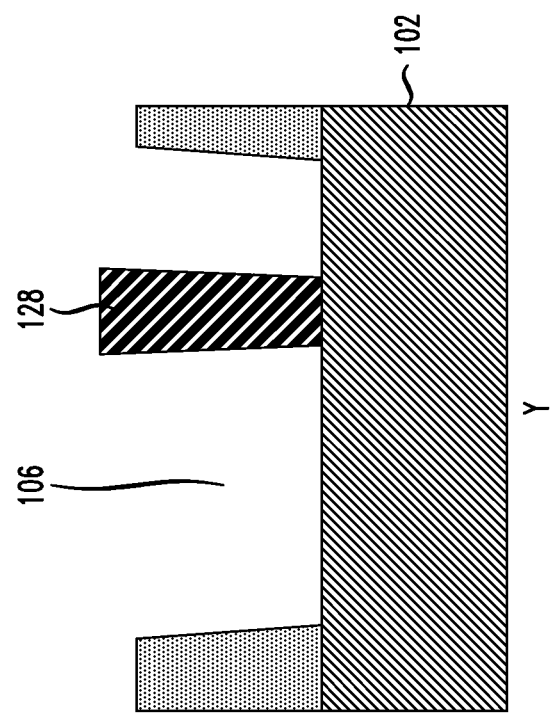

The remaining sacrificial OPL material 114 is also removed via an ash etching process as depicted in FIGS. 12-13. The etching material can be an oxygen ash or a nitrogen or hydrogen-based chemistry including, for example, nitrogen gas or hydrogen gas, or a combination thereof. The ash etching process removes the sacrificial OPL material 114 with little or no gouging of the underlying semiconductor substrate 102. The second dielectric fill material 128 is left within the recesses 126.

Figure 14:
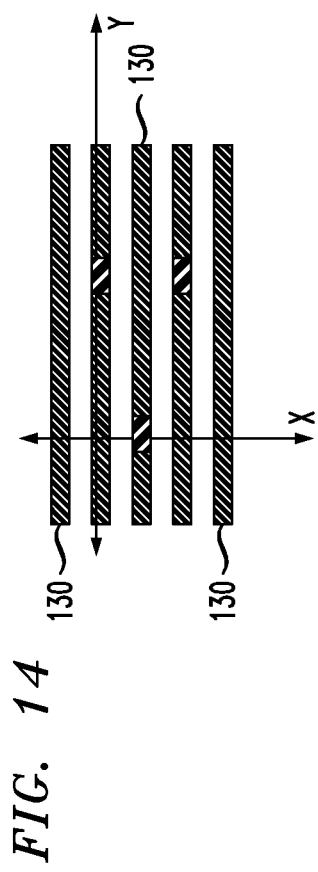
Figure 16:
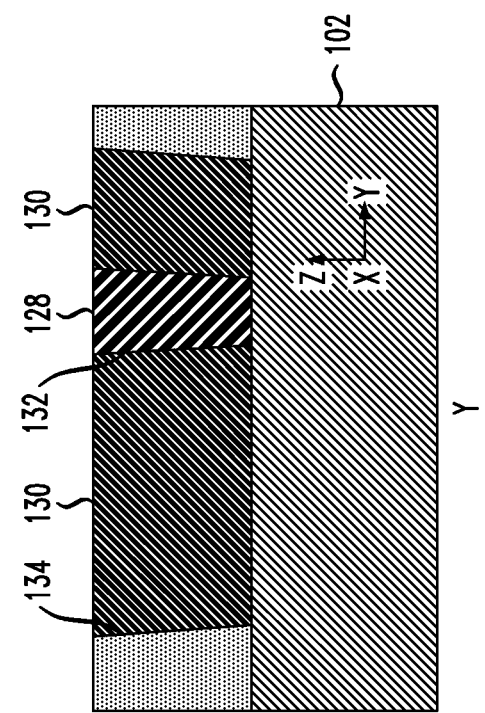
Figure 15:
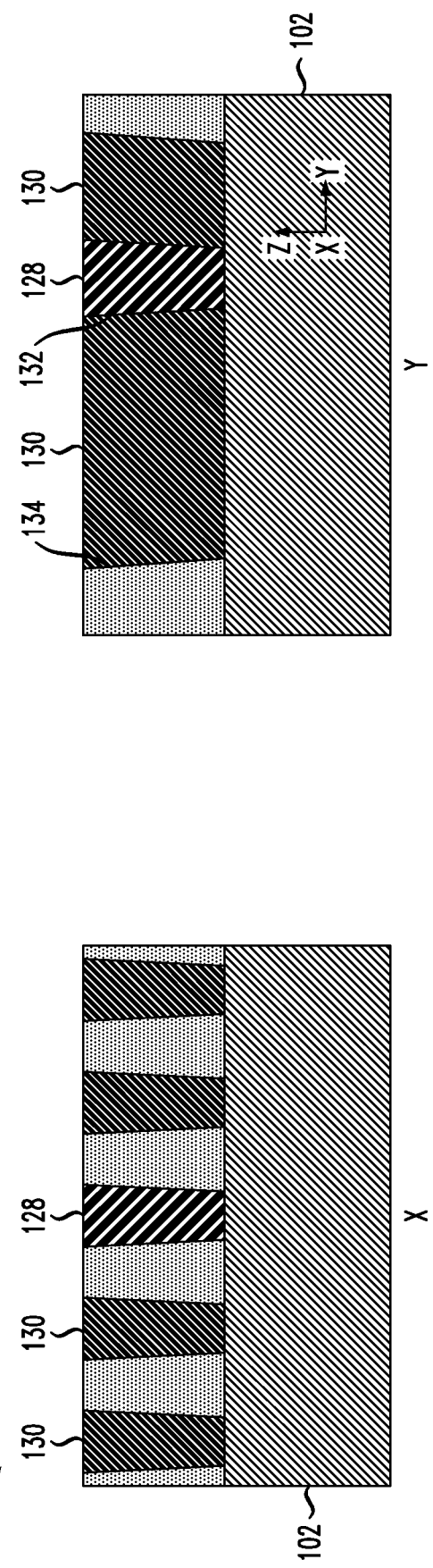
Figure 18:
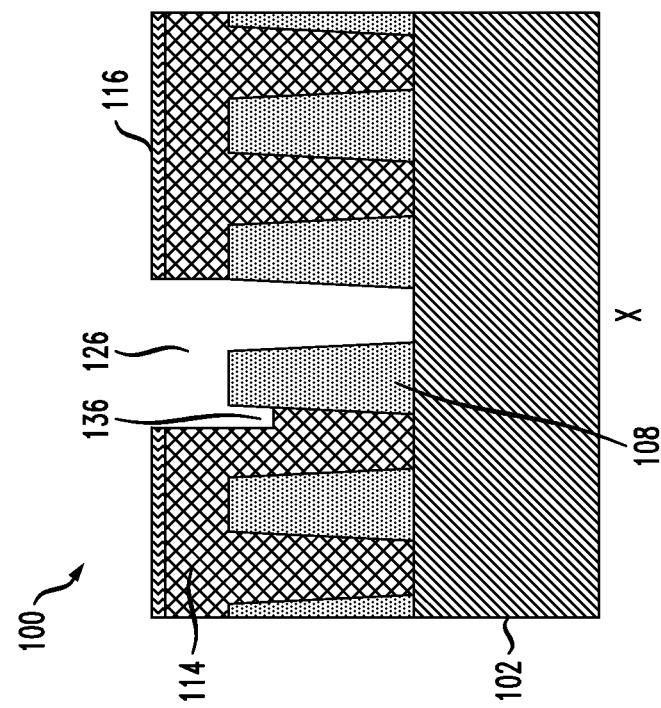
Figure 17:
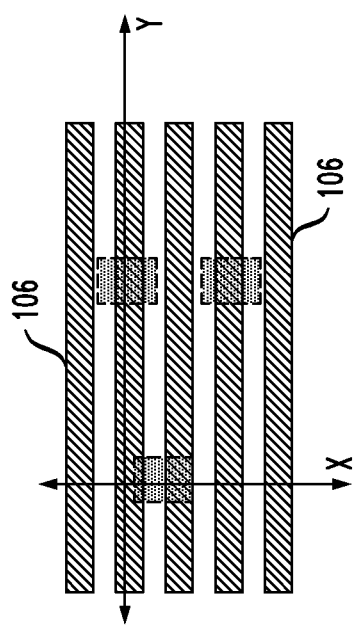

Referring now to FIGS. 14-16, a next phase of the process flow comprises depositing a layer of metallic material to form metallic lines 130 within the trench openings 106 to form the metallic interconnect structures (e.g., metallic lines) extending through the first dielectric layer. FIG. 15 is a cross-sectional view along the x-axis as depicted in FIG. 14 and FIG. 16 is a cross-sectional view along the y-axis as depicted in FIG. 14 and through a trench opening filled with a metallic material. FIGS. 15 and 16 depict the semiconductor structure 100 after planarizing the surface down to the first dielectric layer 104 to remove overburden portions of the metallic lines 130, and form the plurality of metallic lines 130. In embodiments, the metallic lines 130 comprise Cu. In other embodiments, the metallic material 130 can be, for example, aluminum (Al), tungsten (W), iridium (Ir), cobalt (Co), ruthenium (Ru), or alloys thereof. It is also noted that a thin metal liner or combination of multiple metal liners, such as TiN, TaN, Ru, etc can be deposited first as a barrier or an adhesion layer followed by bulk metal deposition. The metallic material 130 is deposited using known dry deposition techniques such as ALD, PVD or CVD or wet deposition techniques such as electroplating, and electroless plating, etc. The planarization process can be implemented using a chemical-mechanical polish (CMP) process with a suitable etch slurry.

With particular reference to FIGS. 15-16, the process described in connection with FIGS. 15-16 creates an extremely small tip-to-tip spacing ranging from about 5 nm to about 30 nm substantially less than conventional lithography processes. In addition, the metal cut wall 132 at a first end of the metallic line defines a positive tapered angle relative to the vertical z-axis ranging from about 830 to about 89° and the side wall at the second end 134 of the metallic line not subject to the metal cut or etching process defines a similar positive angle essentially defining a parallelogram when viewing the metallic line in cross-section along the y-axis. (FIG. 16)

Referring now to FIGS. 17-20, another illustrative embodiment for forming a semiconductor component in accordance with the present disclosure is depicted. This embodiment is substantially similar to the prior embodiment, but is subject to a misaligned resist image or other etching issue. In particular, before lithographic exposure is performed to transfer an image of a lithographic photomask to a photoresist layer, the image of the lithographic photomask must be properly aligned to a previously defined pattern of a given layer of the wafer. The alignment of a lithographic photomask is typically performed using alignment marks that are formed on the lithographic photomask and alignment features or marks that are formed in a layer of the wafer. In particular, a lithographic photomask to pattern a given layer of the wafer comprises an alignment pattern which has a predetermined relationship to alignment marks/features formed on a previous layer of the wafer. During an alignment process, the lithographic exposure tool is configured to visually locate the alignment marks/features formed on a given layer of the wafer, and adjust the position of the lithographic photomask to properly register the alignment pattern of the photomask to the alignment marks/features formed on the wafer. This alignment process is problematic in instances where the layer(s) to be patterned on the wafer are "optically opaque" at the wavelength of the radiation source that is utilized by the lithographic exposure tool for visual alignment of photomasks, as a result of the type of materials and/or the thickness of the layer(s) to be patterned. In such circumstances, the lithographic exposure tool may be unable to properly view the alignment structures on the wafer which are covered by the optically opaque layer(s), thereby resulting in alignment error. Other issues (including etching malfunctions, etc.) may cause the misalignment of a resist image relative to the semiconductor structure.

In accordance with the embodiment of FIGS. 17-20, the etched recess 126 is misaligned and extends between two trench openings 106 along the x-axis. (Compare with FIGS. 5-7). Thus, a gap 136 is defined between the trench opening 106 filled with the sacrificial OPL material 114 and the intervening trench wall 108. (FIG. 18) To rectify this misalignment issue, the gap 136 or divot is filled with a third dielectric material as a liner or film 138 as depicted in FIG. 19. Suitable materials for the liner include, for example, titanium oxide. The liner 138 is deposited to completely fill the void left by the gap 136. Since the dimension of the gap 136 is smaller than the size of the trench opening 106, the thin liner material would only completely fill the gap 136 but does not pinch-off the trench opening 106. After that, an isotropic etch process can be applied to etch back the thin liner material, and the liner 138 will be removed from the trench where it is not pinched-off leaving the section of the liner 138, which is pinched off, unremoved. Thereafter, the second dielectric fill material 128 is deposited in the misaligned recess 126 as described hereinabove in connection with the discussion of FIGS. 12 and 13, and etched back to expose the sacrificial material. (FIG. 20). The presence of the film 138 will ensure that the second dielectric fill material 128 is disposed in the desired trench opening 106 and does not extend to the adjoining or adjacent trench opening 106. The film 138 is thereafter removed followed by metallization as described in connection with FIGS. 15 and 16.

Thus, illustrative embodiments provide a mechanism to facilitate self-alignment of metal cuts in a semiconductor component to ensure adjacent line segments are properly spaced in tip to tip relation. Illustrative embodiments further provide the ability to rectify a situation where the etched recess is misaligned and extends across adjacent trench openings.

It is envisioned that the semiconductor structure may be a part of a semiconductor and also a component of an integrated circuit. The resulting integrated circuit incorporating the semiconductor components can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuits, ranging from toys and other low-end applications to advanced computer products having a display, a keyboard or other input device, and a central processor.

It is to be understood that the embodiments discussed herein are not limited to the particular materials, features, and processing steps shown and described herein. In particular, with respect to the processing steps, it is to be emphasized that the descriptions provided herein are not intended to encompass all of the processing steps that may be required to form a functional semiconductor integrated circuit device.

The descriptions of the various illustrative embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method, comprising:
applying a first dielectric material onto a semiconductor substrate to form a first dielectric layer on the semiconductor substrate;
creating a plurality of trench openings in the dielectric layer;
depositing a sacrificial material within the trench openings of the dielectric layer;
removing the sacrificial material from at least a first segment of a first trench opening of the trench openings;
depositing a second dielectric fill material into the first segment of the first trench opening where the sacrificial material was removed;
removing the sacrificial material from at least some of the remaining trench openings;
depositing a metallic material within the first trench opening to define at least first and second lines in the first trench opening and form a metallic interconnect structure;
removing the sacrificial material from at least a second segment of a second trench opening of the trench openings; and
depositing the second dielectric material into the second segment of the second trench opening where the sacrificial material was removed;
wherein the second dielectric material in the second segment defines a spacing to define third and fourth lines of the metallic interconnect structure.

2. The method of claim 1 comprising depositing metallic material within at least some of remaining trench openings to form the metallic interconnect structure.

3. The method of claim 1 comprising leaving the second dielectric material in the first segment of the first trench opening between the first and second lines.

4. The method of claim 1 wherein depositing the sacrificial material includes forming an organic planarization layer over the semiconductor structure and extending within the trench openings.

5. The method of claim 4 wherein removing the sacrificial material from at least the first segment of the first trench opening includes etching the organic planarization layer in the first trench opening to expose the semiconductor substrate.

6. The method of claim 5 comprising depositing a hard mask and a photoresist layer onto the organic planarization layer, the photoresist layer defining at least one resist image.

7. The method of claim 6 wherein removing the sacrificial material from at least the first segment of the first trench opening includes etching the mask material and the underlying organic planarization layer through the resist image of the photoresist to form a recess.

8. The method of claim 1 wherein the first dielectric layer comprises a "low k" insulating/dielectric material selected from the group consisting of silicon oxide, silicon nitride, silanol, hydrogenated silicon nitride, silicon carbide, silicon carbon nitride or hydrogenated silicon carbide.

9. The method of claim 1 wherein the second dielectric material includes one of silicon nitride, an aluminum oxide or lithium titanate.

10. The method of claim 9 comprising depositing a third liner material into a gap formed between the sacrificial material and one trench intervening wall in the event the recess at least partially spans two adjacent trench openings.

11. The method of claim 10 comprising removing the third liner material subsequent to depositing the second dielectric material into the first segment of the first trench opening where the sacrificial material was removed and prior to depositing the metallic material.

12. A method, comprising:
applying a first dielectric material onto a semiconductor substrate to form a first dielectric layer on the semiconductor substrate;

creating a plurality of trench openings in the dielectric layer, the trench openings being defined between adjacent trench walls;

depositing a sacrificial material within the trench openings of the dielectric layer;

removing the sacrificial material from at least a first segment of a first trench opening of the trench openings to define a recess therein, the recess extending from the first trench opening and at least partially into a second trench opening adjacent the first trench, the first and second trench openings separated by an intervening trench wall;

depositing a liner material into a gap formed between the sacrificial material and the intervening trench wall; and depositing a metallic material within the trench openings to form a metallic interconnect structure.

13. The method of claim 12 wherein the liner material comprises titanium oxide.

14. The method of claim 12 comprising depositing a second dielectric material into the first segment of the first trench opening where the sacrificial material was removed.

15. The method of claim 14 wherein the second dielectric material creates a spacing in the first trench opening whereby, upon depositing the metallic material within the trench openings, the spacing forms first and second lines within the first trench opening.

16. The method of claim 15 comprising removing the liner material subsequent to depositing the second dielectric material into the first segment of the first trench opening where the sacrificial material was removed, and prior to depositing the metallic material.

17. The method of claim 12 comprising:

removing the sacrificial material from at least a second segment of a second trench opening of the trench openings; and depositing the second dielectric material into the second segment of the second trench opening where the sacrificial material was removed;

wherein the second dielectric material in the second segment defines a spacing to define third and fourth lines of the metallic interconnect structure.

18. A semiconductor device manufactured in accordance with the steps of claim 1.

19. A semiconductor device manufactured in accordance with the steps of claim 12.

* * * * *